United States Patent [19]

Jacobs et al.

[11] Patent Number: 4,525,920
[45] Date of Patent: Jul. 2, 1985

[54] METHOD OF MAKING CMOS CIRCUITS BY TWIN TUB PROCESS AND MULTIPLE IMPLANTATIONS

[75] Inventors: Erwin P. Jacobs, Vaterstetten; Ulrich Schwabe, Munich, both of Fed. Rep. of Germany

[73] Assignee: Siemens Aktiengesellschaft, Berlin & Munich, Fed. Rep. of Germany

[21] Appl. No.: 589,639

[22] Filed: Mar. 14, 1984

[30] Foreign Application Priority Data

Apr. 21, 1983 [DE] Fed. Rep. of Germany ....... 3314450

[51] Int. Cl.$^3$ ..................... H01L 21/22; H01L 29/78; H01L 21/263
[52] U.S. Cl. .................................. 29/571; 29/576 B; 29/577 C; 148/1.5; 148/187; 148/DIG. 82; 357/42; 357/91
[58] Field of Search .................. 148/1.5, 187; 29/571, 29/576 B, 577 C; 357/91, 42

[56] References Cited

U.S. PATENT DOCUMENTS

| | | | |
|---|---|---|---|
| 4,315,781 | 2/1982 | Henderson | 148/1.5 |
| 4,374,700 | 2/1983 | Scott et al. | 156/656 |
| 4,420,344 | 12/1983 | Davies et al. | 148/1.5 |
| 4,434,543 | 3/1984 | Schwabe et al. | 29/576 B |
| 4,435,895 | 3/1984 | Parrillo et al. | 29/571 |
| 4,435,896 | 3/1984 | Parrillo et al. | 29/571 |
| 4,442,591 | 4/1984 | Haken | 29/571 |
| 4,459,740 | 7/1984 | Schwabe et al. | 29/576 B |
| 4,459,741 | 7/1984 | Schwabe et al. | 29/576 B |

OTHER PUBLICATIONS

T. Ohzone et al., IEEE Trans. Electr. Dev., ED-27, No. 9, (1980), pp. 1789 through 1795.
Bassous et al., IBM-TDB, 25 (1982) 3353.

*Primary Examiner*—Upendra Roy
*Attorney, Agent, or Firm*—Hill, Van Santen, Steadman & Simpson

[57] ABSTRACT

A method for manufacturing a CMOS circuit wherein a process sequence matched to an n-tub manufacture is carried out. Short-channel properties of n-channel transistors are improved by performing double boron implantations of the channel regions. A single channel implantation is executed for both transistor types. Compared to traditional CMOS processes in n-tub structure, this eliminates involved masking steps. Also, the polysilicon gate is shielded from the boron ion implantation by means of a masking re-oxidation step and the under-diffusion given n-channel and p-channel transistors is greatly reduced by means of pull-back of the boron source/drain implantation. This contributes significantly to a symmetrical $U_T$ behavior of the transistors and to the attainment of high switching speeds. The method is used in the manufacture of VLSI CMOS circuits in VLSI technology.

14 Claims, 12 Drawing Figures

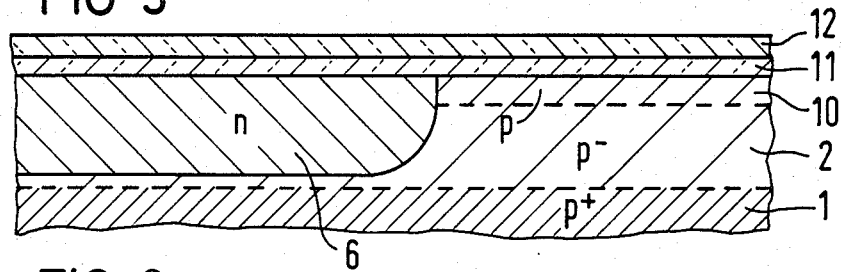
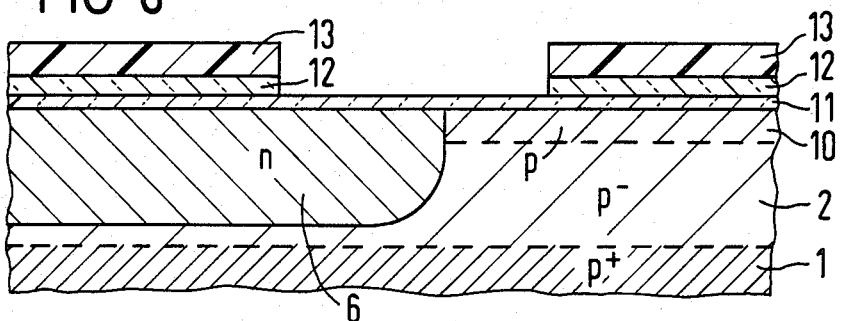
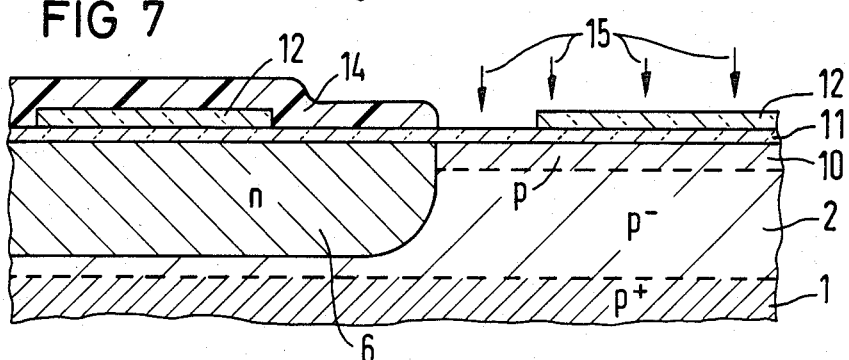
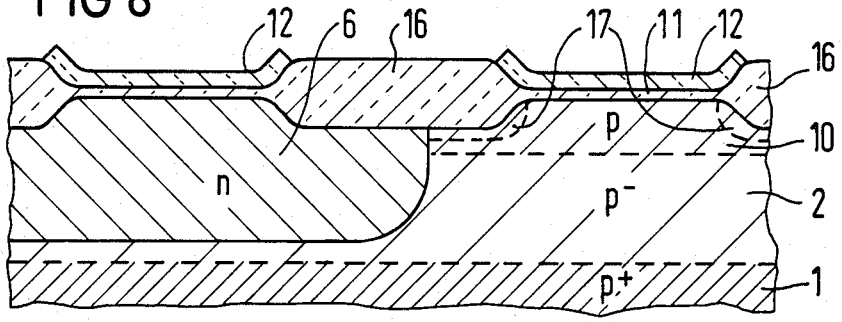

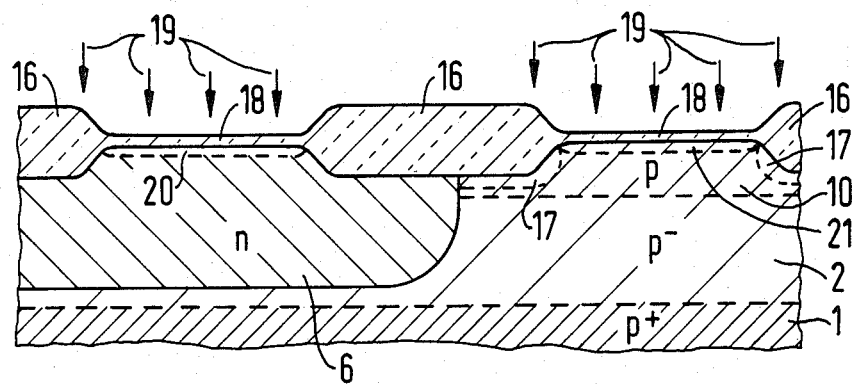
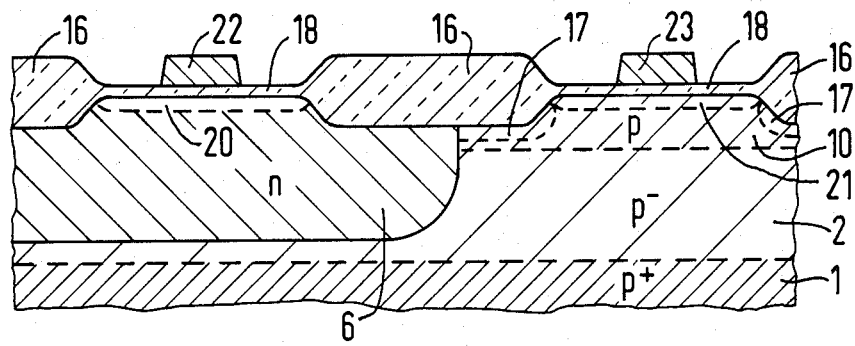
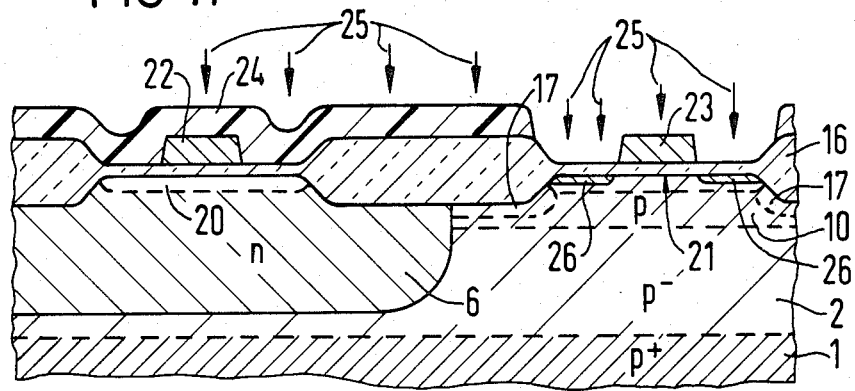

METHOD OF MAKING CMOS CIRCUITS BY TWIN TUB PROCESS AND MULTIPLE IMPLANTATIONS

BACKGROUND OF THE INVENTION

The present patent application relates to a method for manufacturing VLSI complementary MOS-field effect transistor circuits (CMOS circuits), wherein p-doped or n-doped tubs are generated in the silicon substrate for the acceptance of the n-channel or p-channel transistors of the circuit. The corresponding dopant atoms are introduced into the tubs by means of multiple ion implantations for the purpose of setting the various transistor threshold voltages. The masking for the individual ion implantations occurs by means of photosensitive resist, silicon oxide, or silicon nitride structures, and the manufacture of the source/drain regions and gate regions as well as the generation of the intermediate and insulating oxide and of the interconnect level is undertaken according to known method steps of MOS technology.

Modern CMOS processes are two-tub processes which are allocated in format either to a p-tub or an n-tub basic design, i.e. the p-tubs or n-tubs are situated in a n-doped or p-doped large-surface silicon substrate as relatively small-surface islands.

Manufacturing the tubs and setting the various transistor threshold voltages (thin oxide and field oxide transistors in n-channel and p-channel regions) occurs by means of multiple, mutually matched ion implantations.

The principal differences and disadvantages of the known CMOS processes lie in the implementation of these process steps. The process sequence of a known n-tub CMOS process as disclosed, for example, in an article by T. Ohzone et al in the U.S. periodical IEEE Trans. Electr. Dev., ED-27, No. 9 (1980), pages 1789 through 1795, incorporated herein by reference, exhibits, for example, the following considerable disadvantages:

1. A separate mask is required for the n-channel field implantation.
2. The polysilicon gate must be shielded from the boron implantation by a photomask.
3. The execution of the two ion implantation steps in 1 and 2 above is only possible upon application of an involved two-stage photolithography process.

Photolithography steps and additional masks, however, considerably reduce the economic feasibility of the process.

SUMMARY OF THE INVENTION

An object of the present invention is the execution of a CMOS process with the n-tub principle wherein the fewest possible mask-involving process steps are required for the manufacture of the desired circuit, but wherein it is nonetheless assured that the function of the components of the circuit is not hindered. Also, the short-channel properties of the n-channel transistors should be improved.

This object is achieved by means of a method of the type initially cited that is characterized by the following method steps:

(a) Application of a first double layer comprising a silicon oxide and silicon nitride to a p-doped silicon substrate;

(b) Manufacture of the n-tubs by means of a phosphorous, arsenic, or antimony ion implantation after completion of the masking of the remaining regions with a photosensitive resist layer and after removal of the silicon nitride layer in the n-tub region;

(c) Stripping the photosensitive resist mask;

(d) Implementation of a local oxidation process for generating a masking oxide for the following deep boron implantation outside of the n-tub region and of a first indiffusion step of the phosphorous, arsenic, or antimony ions;

(e) Stripping the silicon nitride structures and further driving-in of the n-tub;

(f) Execution of a first boron ion implantation;

(g) Surface-wide stripping of the oxide masking;

(h) Application of a second double layer comprising silicon oxide and silicon nitride to the substrate surface and structuring of the silicon nitride layer covered with a photosensitive resist mask such that the active transistor regions remain covered by the silicon nitride layer;

(i) Stripping the photosensitive resist mask;

(j) Application of a further photosensitive resist layer over the n-tub regions;

(k) Execution of a second boron ion implantation for generating the n-channel field-implanted regions;

(l) Stripping the photosensitive resist structures;

(m) Generating the field oxide regions by means of local oxidation upon employment of the silicon nitride layer as mask;

(n) Removal of the silicon nitride layer and of the oxide layer lying therebelow and execution of an oxidation process for the production of the gate oxide;

(o) Execution of a third surface-wide boron ion implantation for doping the n-channel and p-channel, the implantation dose matching the other implantations and being selected such that as symmetrical as possible a threshold voltage $|U_T|$ is achieved for the n-channel and for the p-channel transistor;

(p) Deposition and structuring of polysilicon for the formation of the gate regions;

(q) Execution of an arsenic or antimony ion implantation in the n-channel transistor region after masking the n-tub regions with photoresist;

(r) Execution of an oxidation process after stripping the photoresist mask such that the oxide layer in the n-tub region does not mask the following source/drain implantation of the p-channel transistors, but can have a masking effect (S/D pull back) in the region of the poly-Si edge;

(s) Execution of a photoresist technique for masking the n-channel transistor region;

(t) Execution of a fourth boron ion implantation for generating the source/drain regions of the p-channel transistors;

(u) Removal of the photoresist masking; and (v) Generating the insulating layer, the contact hole regions, and the metal interconnect level in a known manner.

It is also within the scope of the invention that a phosphorous ion implantation is executed in method step (q) instead of the arsenic ion implantation. Method step (r) is thus carried out before method step (q).

Also, the boron ion implantations, particularly according to method step (f), can be executed upon employment of boron fluoride ($BF_2$). The energy is then about four times as high; this enables lower penetration depths with a given lower limit energy of the implantation machines.

The method according to the teaching of the invention—which requires only eight masks and six ion implantations—differs over previously known n-tub CMOS processes on the basis of the following advantages:

1. Improvement of the short-channel properties of the n-channel transistors due to double boron ion implantation of the channel region (according to method step (f) and (o));

2. Elimination of the channel ion implantation mask for the n-channel transistors as a result of a single channel implantation for both transistor types (according to method step (o));

3. Shielding the polysilicon gate from the boron ion implantation as a result of the masking re-oxidation step (according to method step (r)); and 4. Conformity of the under-diffusion in n-channel and p-channel transistors due to pull-back of the source-/drain implantation by means of polysilicon oxidation (according to method step (r)).

Regarding 1: Whereas a sufficient breakdown voltage stability is assured in the p-channel transistors even given short channel lengths as a consequence of the high n-tub doping (concentration of 3 to $5 \times 10^{15}$ $P^+ cm^{-3}$), an additional doping is required in the case of the n-channel transistors if a premature punch-through breakdown is to be avoided given short channel lengths.

According to the teaching of the invention, this is achieved by means of a deep boron ion implantation according to method step (f) which, together with the channel implantation according to method step (o), yields an effective double implantation of the active n-channel regions. The deep implantation is provided in self-adjusting manner relative to the n-tub by means of a local oxide mask.

Regarding 2: Since a premature breakdown of the n-channel transistor is prevented due to the preceding deep boron ion implantation (concentration of $c_B = 3 \times 10^{15}$ cm$^{-3}$ for a penetration depth $x_j = 0.5$ μm), the threshold voltages of both n-channel or p-channel transistors can be simultaneously set by means of a single, shared flat boron ion implantation according to method step (o). A channel ion implantation mask is thus superfluous.

Regarding 3: As a consequence of the different oxidation rates of n$^+$-doped silicon (S/D regions, n-channel), n$^-$-doped silicon (n-tub) and polysilicon, different oxide thicknesses can be set by means of *one* re-oxidation step according to method step (r) or before method step (q) (see FIG. 12 for method step (r) when an arsenic ion implantation exists: $d_1 \approx 130$ nm, $d_2 \approx 120$ nm, $d_3 \approx 65$ nm; and when a phosphorous ion implantation exists: $d_1 \approx 230$ nm, $d_2 \approx 210$ nm, $d_3 \approx 70$ nm). During the subsequent S/D boron ion implantation according to method step (t), the oxide thickness $d_1$ acts as a masking of the polysilicon region, whereas $d_3$ is thin enough that it does not shield the boron ion implantation according to method step (t).

Regarding 4: The described re-oxidation step according to method step (r) further serves to pull back the S/D boron ion implantation. Given the subsequent temperature loads, the higher out-diffusion of the boron doped S/D regions (p-channel transistors) in comparison to the n$^+$(As$^+$, P$^+$, Sb$^+$)-doped S/D regions (n-channel transistors) is compensated. The underdiffusion beneath the active gates and, thus, the parasitic Miller capacitances, are greatly reduced. This contributes significantly to a symmetrical $U_T(L)$ behavior (channel-length dependency of the threshold voltages) of the transistors and to achieving high switching speeds.

It is within the framework of the invention that, given use of metal silicides, preferably tantalum silicide, instead of polysilicon as the gate material according to method step (p), a $SiO_2$ deposition is carried out, and this oxide layer is subsequently etched off by means of an anisotropic etching process such that a sufficiently thick oxide layer (oxide spacer) remains at the poly-Si edges in order to obtain a S/D pull-back effect.

BRIEF DESCRIPTION OF THE DRAWINGS

Drawing FIGS. 1 through 12 illustrate in cross-section the various method steps showing the inventive method for manufacturing VLSI complementary MOS-field effect transistor circuits.

DESCRIPTION OF THE PREFERRED EMBODIMENTS

Figure 1:
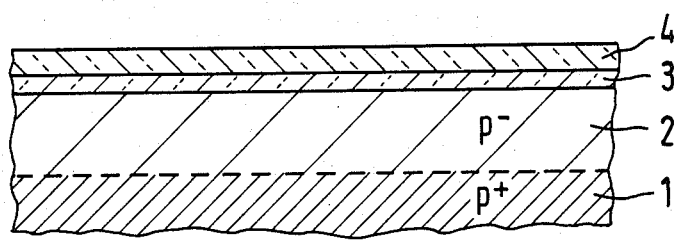

FIG. 1 illustrates in cross-section the beginning of the process sequence wherein a double layer comprising a $SiO_2$ layer 3 (50 nm) and a silicon nitride layer 4 (140 nm) is deposited on a p$^+$-doped silicon substrate 1 (0.01 through 0.02 Ohm cm) oriented in the 100 direction, the substrate being provided with a p$^-$-doped epitaxial layer 2 (6 through 10 μm thick, 20 Ohm cm).

Figure 2:
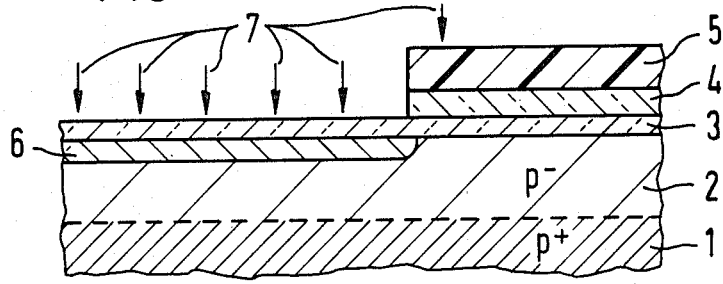

FIG. 2 illustrates that with the assistance of a photoresist structure 5, the silicon nitride layer 4 is structured and the n-tub 6 is generated by means of a phosphorous ion implantation 7 having a dosage and energy of 2 through $2.5 \times 10^{12}$ cm$^{-2}$ and 160 keV, respectively.

Figure 3:
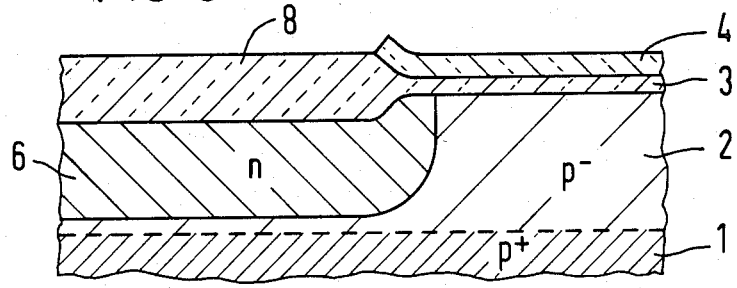

As shown in FIG. 3, after stripping the photoresist structure (5), a local oxidation process is executed for generating a masking oxide 8 (500 nm) for the subsequent deep boron implantation (9) and the phosphorous ions (7) are thereby diffused into the n-tub region 6.

Figure 4:
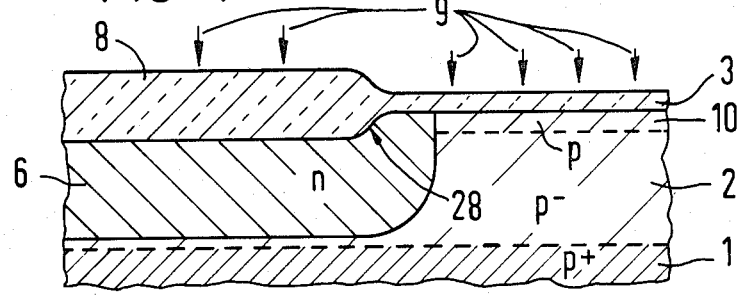

In FIG. 4, after stripping the silicon nitride structure (4), a further in-diffusion step of the n-tub (drive-in in ≈ 2 through 6 μm) and the deep boron implantation (see arrow 9) having a dose and energy of 3 through $7 \times 10^{11}$ cm$^{-2}$ and 60 keV, respectively, are executed self-adjusting relative to the n-tub 6 through the local oxide mask 8. The p-doped zone 10 arises. The oxide edge identified with the arrow 28 is omitted in the following Figures.

FIG. 5 illustrates that after removal of the oxide mask (8), a further double layer consisting of silicon oxide 11 and silicon nitride 12 is applied to the substrate surface (1,2,6,10).

In FIG. 6, the silicon nitride layer 12 is structured with a photoresist mask 13 such that it covers the active transistor regions in the substrate.

In FIG. 7, after stripping the photoresist mask 13, a further photoresist structure 14 for masking the n-tub 6 is generated and the n-channel field implantation (see arrow 15) is executed with boron ions given a dose and energy of 1 to $2 \times 10^{13}$ cm$^{-2}$ and 25 keV.

As shown in FIG. 8, after stripping the photoresist structure 14, the field oxide regions 16 are then generated in a layer thickness of 800 through 1000 nm by means of local oxidation upon utilization of the silicon nitride layer 12 as mask. The p-doped zones 17 thereby arise.

In FIG. 9, after stripping the silicon nitride layer 12 and the silicon oxide layer 11, a thermal oxidation of the entire surface is carried out, whereby the thickness of the gate oxide layer 18 is set at 15 to 50 nm. A surface-wide, flat boron ion implantation (see arrow 19) then follows for doping the p-channel and n-channel (20,21), whereby the implantation dose is selected in conformity with the other implantations such that as symmetrical as possible a threshold voltage $U_T$ is achieved for the n-channel and for the p-channel. In the present exemplary embodiment, the implantation dose and energy are set to $4.5 \times 10^{11}$ B+cm$^{-2}$ and 25 keV, respectively, this corresponding to a threshold voltage of $|U_T| = \approx 0.8$ V. Since the ion implantation (19) is carried out in surface-wide fashion, a mask is not required—in contrast to known CMOS processes.

In FIG. 10, the deposition of the polysilicon level (500 nm) and its structuring now occur whereby the gate electrodes 22 and 23 are formed.

In FIG. 11, the n-tub regions 6 are covered by means of a photoresist mask 24 and the source/drain regions 26 of the n-channel transistors (21) are generated by means of a subsequent arsenic ion implantation (see arrow 25) having a dosage and energy of $6 \times 10^{15}$ cm$^{-2}$ and 80 keV, respectively.

Figure 12:
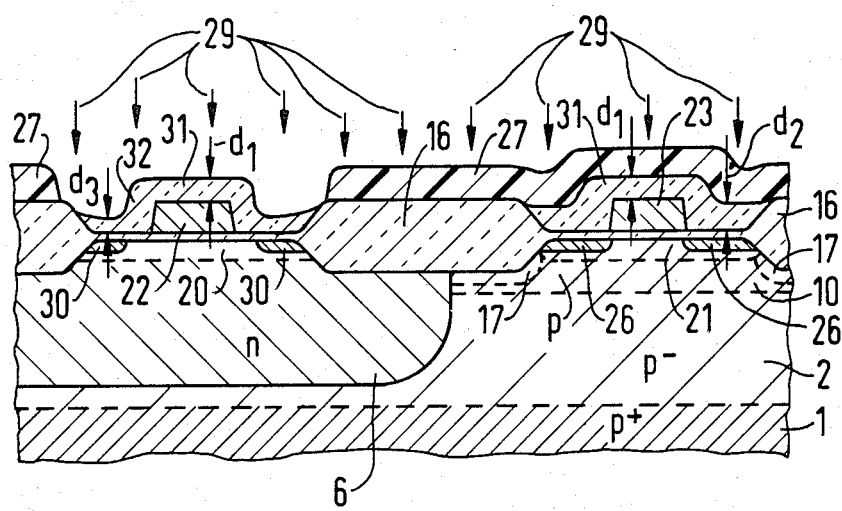

Finally, in FIG. 12, after stripping the photoresist mask 24, a thermal oxidation process (re-oxidation layer 31) is executed wherein the source/drain regions 26 of the n-channel transistors are also driven in. Moreover, the oxidation process (re-oxidation) is managed such that the oxide layer ($d_1$) over the polysilicon gates 22 and $23 \approx 130$ nm, the oxide layer $d_2$ over the n+-doped source/drain zones $26 \approx 120$ nm, and the oxide layer $d_3$ in the source/drain region (6) of the p-channel transistors amounts to $\approx 65$ nm, and does not mask the following source/drain implantation (29) of the p-channel transistors. After application of a photoresist mask 27 for masking the n-channel transistor region, the surface-wide boron ion implantation (see arrow 29) is now executed for generating the source/drain zones 30 of the p-channel transistors in the n-tub 6. The dosage and energy are thus set to $4 \times 10^{15}$ cm$^{-2}$ and 25 keV, respectively. The oxide layer 32 on the edges of the poly-Si gate of the p-channel transistors thus serves to pull back the implantation (source/drain pull-back). The source/drain regions 30 of the p-channel transistors arise after stripping the photoresist mask 27 as a result of driving in the implanted boron atoms.

The generation of the insulating layer, of the contact hole regions, and of the metal interconnect level occurs in accordance with known method steps of CMOS technology and is not illustrated.

Using similar techniques, it is within the scope of the invention to provide p-doped tubs instead of n-doped tubs by appropriate conductivity type choices in the previously described method steps.

Although various minor changes and modifications might be proposed by those skilled in the art, it will be understood that we wish to include within the claims of the patent warranted hereon all such changes and modifications as reasonably come within my contribution to the art.

We claim as our invention:

1. A method for manufacturing VLSI complementary MOS field effect transistor circuits wherein n-doped tubs are generated in a silicon substrate for acceptance of p-channel transistors of the circuit, corresponding dopant atoms being introduced into said tubs by means of multiple ion implantations for setting various transistor threshold voltages, comprising the steps of:

(a) applying a first double layer comprising silicon oxide and silicon nitride to a p-doped silicon substrate;

(b) manufacturing the n-doped tubs by means of an ion implantation after completion of masking of remaining regions with a photoresist mask and after removal of the silicon nitride layer at the n-tub region, the implantation utilizing one of the elements selected from the group consisting of phosphorous, arsenic, and antimony;

(c) stripping the photoresist mask;

(d) performing a local oxidation process for generating a masking oxide for a following deep boron implantation outside of the n-tub region and first in-diffusion step of the phosphorous, arsenic or antimony ions;

(e) stripping the silicon nitride structures followed by a selective drive-in of the n-tub;

(f) executing a first boron ion implantation;

(g) providing a surface-wide stripping of the oxide mask;

(h) applying a second double layer comprising silicon oxide and silicon nitride to the substrate surface and structuring the silicon nitride layer covered with a photoresist mask such that n-channel and p-channel active transistor regions to be formed remain covered by the silicon nitride layer;

(i) stripping the photoresist mask;

(j) applying a further photoresist layer over the n-tub regions;

(k) executing a second boron ion implantation for generating n-channel field-implanted regions;

(l) stripping the photoresist structures;

(m) generating the field oxide regions by means of local oxidation by use of the silicon nitride layer as mask;

(n) removing the silicon nitride layer and the oxide layer lying therebelow and executing an oxidation process for manufacturing the gate oxide;

(o) executing a third, surface-wide boron ion implantation for doping the n-channel and the p-channel whereby the implantation dosage is selected in conformity with the other implantations such that as symmetrical as possible a threshold voltage $|U_T|$ is achieved for the n-channel and the p-channel transistors;

(p) depositing and structuring gate regions on the gate oxide at the transistor regions;

(q) to create source/drain regions for the n-channel transistors, executing an ion implantation in the n-channel transistor region after masking the n-tub regions with photoresist, said ion implantation utilizing one of the elements selected from the group consisting of arsenic and antimony;

(r) executing an oxidation process after stripping the photoresist masking such that an oxide layer thus created in the n-tub region does not mask a subsequent source/drain implantation of the p-channel transistors but such that it can have a masking effect in a region of edges of the polysilicon gate;

(s) executing a photoresist technique for masking the n-channel transistor region;

(t) executing a fourth boron ion implantation for generating the source/drain regions of the p-channel transistors;

(u) removing the photoresist masking; and (v) depositing an insulating layer, etching a contact hole therein, and forming a metal interconnect level thereafter.

2. A method according to claim 1 including providing the substrate as p-doped silicon of 20 Ohm cm oriented in <100> direction.

3. A method according to claim 1 including providing the substrate as an epitaxial layer in the range of 6 to 10 μm thickness on a p+-doped silicon layer of 0.01 through 0.02 Ohm cm.

4. A method according to claim 1 wherein said first double layer is comprised of a 40 to 60 nm thick $SiO_2$ layer and a 120 to 160 nm thick silicon nitride layer is employed.

5. A method according to claim 1 wherein a dosage and energy of said ion implantation after completion of masking according to method step (b) is set to a range of 2 to $2.5 \times 10^{12}$ $cm^{-2}$ and 150 to 180 keV.

6. A method according to claim 1 wherein a dosage of energy for the first boron ion implantation according to method step (f) are in ranges from 4 to $6 \times 10^{11}$ $cm^{-2}$ and 40 to 60 keV, for the second boron ion implantation according to method step (k) ranges from 1 to $1.5 \times 10^{13}$ $cm^{-2}$ and 20 to 25 keV is provided, for the third surface-wide boron ion implantation according to method step (o) ranges of 4 to $6 \times 10^{11}$ $cm^{-2}$ and 20 to 25 keV are provided, and for the fourth boron ion implantation according to method step (t) ranges of 4 to $5 \times 10^{15}$ $cm^{-2}$ and 10 to 25 keV are provided.

7. A method according to claim 1 wherein the dosage and energy for the ion implantation according to method step (q) are in a range from 5.5 to $6.5 \times 10^{15}$ $cm^{-2}$ and 30 to 80 keV.

8. A method according to claim 1 wherein for the oxidation process according to method step (r) the oxide layer thickness $d_1$ over the gate electrode and comprising polysilicon is substantially 130 nm, the oxide layer thickness $d_2$ over the n-channel region is substantially 120 nm, and the oxide layer thickness $d_3$ over the p-channel region is substantially 65 nm.

9. A method according to claim 1 wherein polysilicon is employed as the gate region in method step (p).

10. A method according to claim 1 wherein tantalum silicide ($TaSi_2$) is employed as a metal silicide for the gate region in method step (p).

11. A method according to claim 1 wherein given employment of metal silicide for the gate according to method step (p), a $SiO_2$ deposition is carried out and an anisotropic etching process is subsequently executed such that this oxide layer is etched off such that a sufficiently thick oxide layer remains at the polysilicon edges in order to achieve a source/drain pull-back effect.

12. A method according to claim 6 wherein the boron implantation according to method step (t) is carried out with boron fluoride.

13. A method for manufacturing VLSI complementary MOS field effect transistor circuits wherein n-doped tubs are generated in a silicon substrate for acceptance of transistors of the circuit, corresponding dopant atoms being introduced into said tubs by means of multiple ion implantations for setting various transistor threshold voltages, comprising the steps of:

(a) applying a first double layer comprising silicon oxide and silicon nitride to a p-doped silicon substrate;

(b) manufacturing the n-doped tubs by means of an ion implantation after completion of masking of remaining regions with a photoresist mask and after removal of the silicon nitride layer at the n-tub region, the implantation utilizing one of the elements selected from the group consisting of phosphorous, arsenic, and antimony;

(c) stripping the photoresist mask;

(d) performing a local oxidation process for generating a masking oxide for a following deep borom implantation outside of the n-tub region and a first in-diffusion step of the phosphorous, arsenic or antimony ions;

(e) stripping the silicon nitride structures followed by a selective drive-in of the n-tub;

(f) executing a first boron ion implantation;

(g) providing a surface-wide stripping the oxide mask;

(h) applying a second double layer comprising silicon oxide and silicon nitride to the substrate surface, and structuring the silicon nitride layer covered with a photoresist mask such that n-channel and p-channel active transistor regions to be formed remain covered by the silicon nitride layer;

(i) stripping the photoresist mask;

(j) applying a further photoresist layer over the n-tub regions;

(k) executing a second boron ion implantation for generating n-channel field-implanted regions;

(l) stripping the photoresist structures;

(m) generating the field oxide regions by means of local oxidation by use of the silicon nitride layer as mask;

(n) removing the silicon nitride layer and the oxide layer lying therebelow and executing an oxidation process for manufacturing the gate oxide;

(o) executing a third, surface-wide boron ion implantation for doping the n-channel and the p-channel whereby the implantation dosage is selected in conformity with the other implantations such that as symmetrical as possible a threshold voltage $|U_T|$ is achieved for the n-channel and the p-channel transistors;

(p) depositing and structuring gate regions on the gate oxide at the transistor regions;

(q) executing an oxidation process after stripping of the photoresist masking such that an oxide layer thus created in the n-tub region does not mask a subsequent source/drain implantation of the p-channel transistors but such that it can have a masking effect in a region of edges of the polysilicon gate;

(r) to create source/drain regions for the n-channel transistors, executing a phosphorous ion implantation in the n-channel transistor region after masking the n-tub regions with photoresist;

(s) executing a photoresist technique for masking the n-channel transistor region;

(t) executing a fourth boron ion implantation for generating the source/drain regions of the p-channel transistors;

(u) removing the photoresist masking; and (v) depositing an insulating layer, etching a contact hole therein, and forming a metal interconnect level thereafter.

14. A method for manufacturing VLSI complementary MOS field effect transistor circuits comprising the steps of:

(a) applying a first double layer comprising silicon oxide and silicon nitride to a p-doped silicon substrate;

(b) manufacturing the n-doped tubs by means of an ion implantation after completion of masking of remaining regions with a photoresist mask and after removal of the silicon nitride layer at the n-tub region, the implantation utilizing one of the elements selected from the group consisting of phosphorous, arsenic, and antimony;

(c) stripping the photoresist mask;

(d) performing a local oxidation process for generating a masking oxide for a following deep boron implantation outside of the n-tub region and a first in-diffusion step of the phosphorous, arsenic or antimony ions;

(e) stripping the silicon nitride structures following the selective drive-in of the n-tub;

(f) executing a first boron ion implantation;

(g) providing surface-wide stripping of the oxide mask;

(h) applying a second double layer comprising silicon oxide and silicon nitride to the substrate surface and structuring the silicon nitride layer covered with a photoresist mask such that n-channel and p-channel active transistor regions to be formed remain covered by the silicon nitride layer;

(i) stripping the photoresist mask;

(j) applying a further photoresist layer over the n-tub regions;

(k) executing a second boron ion implantation for generating n-channel field-implanted regions;

(l) stripping the photoresist structures;

(m) generating the field oxide regions by means of local oxidation by use of the silicon nitride layer as mask;

(n) removing the silicon nitride layer and the oxide layer lying therebelow and executing an oxidation process for manufacturing the gate oxide;

(o) executing a third, surface-wide boron ion implantation for doping the n-channel and the p-channel transistors;

(p) depositing and structuring gate regions on the gate oxide at the transistor regions;

(q) to create source/drain regions for the n-channel transistors, executing an ion implantation in the n-channel transistor region after masking the n-tub regions with photoresist, said ion implantation utilizing one of the elements selected from the group consisting of arsenic and antimony;

(r) executing an oxidation process after stripping the photoresist masking such that an oxide layer thus created in the n-tub region does not mask a subsequent source/drain implantation of the p-channel transistors but such that it can have a masking effect in a region of edges of the polysilicon gate;

(s) executing a photoresist technique for masking the n-channel transistor region;

(t) executing a fourth boron ion implantation for generating the source/drain regions of the p-channel transistors;

(u) removing the photoresist masking; and (v) depositing an insulating layer, etching a contact hole therein, and forming a metal interconnect level thereafter.

* * * * *